(12) United States Patent
Yang et al.

(10) Patent No.: US 11,120,618 B2
(45) Date of Patent: Sep. 14, 2021

(54) DISPLAY OF ITEM INFORMATION IN CURRENT SPACE

(71) Applicant: Ke.com (Beijing) Technology Co., Ltd., Beijing (CN)

(72) Inventors: Bin Yang, Beijing (CN); Li Yang, Beijing (CN); Chong Su, Beijing (CN); Weilan Yin, Beijing (CN); Yuke Yang, Beijing (CN); Chengcong Xin, Beijing (CN); Yilang Hu, Beijing (CN); Yi Zhu, Beijing (CN); Yiding Wang, Beijing (CN)

(73) Assignee: KE.COM (BEIJING) TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/095,702

(22) Filed: Nov. 11, 2020

(65) Prior Publication Data

US 2021/0065433 A1    Mar. 4, 2021

Related U.S. Application Data

(63) Continuation of application No. PCT/CN2020/098593, filed on Jun. 28, 2020.

(30) Foreign Application Priority Data

Jun. 27, 2019 (CN) .......................... 201910570127.X
Jun. 27, 2019 (CN) .......................... 201910570131.6

(51) Int. Cl.
*G06T 15/20* (2011.01)
*G06T 7/70* (2017.01)

(52) U.S. Cl.
CPC .............. *G06T 15/20* (2013.01); *G06T 7/70* (2017.01)

(58) Field of Classification Search
None
See application file for complete search history.

(56) References Cited

U.S. PATENT DOCUMENTS 10,672,144 B2    6/2020  Tian
2015/0035822 A1*  2/2015  Arsan ................... G06T 19/006
                                                              345/419

(Continued)

FOREIGN PATENT DOCUMENTS

CN        105183862 A    12/2015
CN        106600709 A     4/2017

(Continued)

*Primary Examiner* — Frank S Chen
(74) *Attorney, Agent, or Firm* — Mauriel Kapouytian Woods LLP; Michael Mauriel

(57) ABSTRACT

Provided are a method and an apparatus for displaying item information in a current space, an electronic device, and a non-transitory machine-readable storage medium. The method comprises: obtaining spatial data of a current position in a current space, and obtaining position data and information data of at least one item in the current space according to the spatial data; calculating a display priority of the at least one item in the current space according to the spatial data, the position data, and the information data; and displaying the information data of the at least one item according to the display priority. Through the method, the display priority of the information data of the at least one item in the current space are calculated, and then the information data of the at least one item in the current space is displayed according to the display priority, so that it is convenient for a user to directly view the information data of the at least one item in the current space.

19 Claims, 7 Drawing Sheets

(56) References Cited

U.S. PATENT DOCUMENTS

| | | | |
|---|---|---|---|
| 2015/0362520 A1* | 12/2015 | Wells | G01C 21/16 |
| | | | 702/141 |
| 2015/0379770 A1* | 12/2015 | Haley, Jr. | G06T 19/006 |
| | | | 345/633 |
| 2016/0179336 A1* | 6/2016 | Ambrus | G02B 27/017 |
| | | | 715/768 |
| 2018/0293402 A1 | 10/2018 | Bilotta | |
| 2018/0374276 A1* | 12/2018 | Powers | G06T 19/20 |

FOREIGN PATENT DOCUMENTS

| | | |
|---|---|---|
| CN | 106980690 A | 7/2017 |
| CN | 107102730 A | 8/2017 |
| CN | 107870962 A | 4/2018 |
| CN | 108055387 A | 5/2018 |
| CN | 108492379 A | 9/2018 |
| CN | 108877848 A | 11/2018 |
| CN | 108961426 A | 12/2018 |
| CN | 109191252 A | 1/2019 |
| CN | 109829977 A | 5/2019 |
| CN | 110414054 A | 11/2019 |
| JP | 6335710 B2 | 5/2018 |

\* cited by examiner

DISPLAY OF ITEM INFORMATION IN CURRENT SPACE

CROSS-REFERENCE TO RELATED APPLICATIONS

This application is a continuation of International Application No. PCT/CN2020/098593, filed on Jun. 28, 2020 and claims priority to Chinese Patent Applications Nos. CN201910570131.6 and CN201910570127.X filed on Jun. 27, 2019, which are incorporated herein by reference in their entireties for all purposes.

TECHNICAL FIELD

Embodiments of the present disclosure relates to the field of computer software technologies, and in particular, to a method and an apparatus for displaying item information in a current space, an electronic device, and a non-transitory machine-readable storage medium.

BACKGROUND ART

In a house describing mode, a pre-recorded audio description of a functional room of a house is automatically played when a page jumps to the functional room. This process simulates a description made by a broker after entering each functional room during an actual house tour guided by the broker for a client. However, it is not convenient for the user to directly view furniture information in this process.

SUMMARY OF THE INVENTION

The present disclosure is provided to solve the technical problem that furniture information in an existing functional room cannot be directly viewed.

In view of the above disadvantage in the prior art, the present disclosure provides a method and an apparatus for displaying item information in a current space, an electronic device, and a non-transitory machine-readable storage medium, which can solve the technical problem that the furniture information in the functional room cannot be viewed conveniently in the prior art.

A first aspect of the present disclosure provides a method for displaying item information in a current space, the method comprising: obtaining spatial data of a current position in the current space, and obtaining position data and information data of at least one item in the current space according to the spatial data; calculating a display priority of the at least one item in the current space according to the spatial data, the position data, and the information data; and displaying the information data of the at least one item according to the display priority.

Optionally, the spatial data comprises position data of the current position and current viewing angle data; and the step of obtaining spatial data of a current position in the current space, and obtaining position data and information data of at least one item in the current space according to the spatial data comprises: obtaining the position data of the current position and the current viewing angle data in response to a user operation; determining a database of the current space according to the position data of the current position; and obtaining position data and information data of the at least one item within a current viewing angle range from the database according to the position data of the current position and the current viewing angle data, wherein the current viewing angle range comprises the current space.

Optionally, the current viewing angle range further comprises a connected space, the connected space being in communication with the current space through an opening; and the at least one item within the current viewing angle range further comprises an item in the connected space viewable from the current viewing angle, and the position data and the information data of the at least one item within the current viewing angle range comprise position data of the item in the connected space viewable from the current viewing angle and information data of the item in the connected space viewable from the current viewing angle.

Optionally, the step of calculating a display priority of the information data of the at least one item in the current space according to the spatial data, the position data, and the information data comprises: calculating a distance from the at least one item to the current position in the current space according to the position data of the current position and the position data and the information data of the at least one item in the current space; and setting display priorities in descending order for the information data of the at least one item in the current space according to distances in ascending order.

Optionally, the method further comprises: setting the display priority of the information data of the at least one item in the current space if a distance from the at least one item to the current position in the current space is less than a preset distance; and setting the display priority of the information data of the at least one item within the current viewing angle range if definition of the at least one item within the current viewing angle range is higher than preset definition.

Optionally, the information data comprises dimension data of the item; and the step of calculating a distance from the at least one item to the current position in the current space according to the position data of the current position and the position data and the information data of the at least one item in the current space comprises: according to the dimension data and the position data of the at least one item in the current space, calculating position data of a surface of the at least one item in the current space, and determining a shortest straight-line distance from the surface of the at least one item to the current position in the current space as the distance from the at least one item to the current position in the current space; or according to the dimension data and the position data of the at least one item in the current space, calculating position data of a central position of the at least one item in the current space, and determining a straight-line distance from the central position to the current position as the distance from the at least one item to the current position in the current space.

Optionally, the display priority comprises a first display priority; and the step of calculating a display priority of the at least one item in the current space according to the spatial data, the position data, and the information data comprises: when the information data of the at least one item within the current viewing angle range is obtained, calculating a first distance from the at least one item within the current viewing angle range to the current position according to the position data of the current position and the position data and the information data of the at least one item within the current viewing angle range; and setting first display priorities in descending order for the information data of the at least one item within the current viewing angle range according to first distances in ascending order.

Optionally, the display priority further comprises a second display priority; and the step of calculating a display priority of the at least one item in the current space according to the spatial data, the position data, and the information data further comprises: when the information data of the at least one item within the current viewing angle range is obtained, calculating a second distance from the at least one item to the current position beyond the current viewing angle range according to the position data of the current position and the position data and the information data of the at least one item beyond the current viewing angle range; and setting second display priorities in descending order for the information data of the at least one item beyond the current viewing angle range according to second distances in ascending order, wherein the second display priority is lower than the first display priority.

Optionally, the step of displaying the information data of the at least one item in the current space according to the display priority comprises: sequentially displaying the information data from top to bottom according to the first display priorities when a user views the information data of the at least one item within the current viewing angle range; sequentially displaying the information data from top to bottom according to the first display priorities and the second display priorities; or, sequentially displaying the information data from top to bottom only according to the first display priorities, and in a case that the user views the information data of the at least one item beyond the current viewing angle range, sequentially displaying the information data from top to bottom according to the second display priorities.

Optionally, the spatial data comprises position data of the current position and current viewing angle data, and the method further comprises: updating the position data of the current position and current viewing angle data to default position data and default viewing angle data of the changed current position in a case that the current position is changed; and updating the current viewing angle data in a case that a current viewing angle is changed.

A second aspect of the present disclosure provides an apparatus for displaying item information in a current space, the apparatus comprising: an obtaining module configured to obtain spatial data of a current position in a current space, and obtain position data and information data of at least one item in the current space according to the spatial data; a calculation module configured to calculate a display priority of the at least one item in the current space according to the spatial data, the position data, and the information data; and a display module configured to display the information data of the at least one item according to the display priority.

Optionally, the spatial data comprises position data of the current position and current viewing angle data; and the obtaining module comprises: a first obtaining module configured to obtain the position data of the current position and the current viewing angle data in response to a user operation; a database determining module configured to determine a database of the current space according to the position data of the current position; and a second obtaining module configured to obtain position data and information data of the at least one item within a current viewing angle range from the database according to the position data of the current position and the current viewing angle data, wherein the current viewing angle range comprises the current space.

Optionally, the current viewing angle range further comprises a connected space, the connected space being in communication with the current space through an opening; and the at least one item within the current viewing angle range further comprises an item in the connected space viewable from the current viewing angle, and the position data and the information data of the at least one item within the current viewing angle range comprise position data of the item in the connected space viewable from the current viewing angle and information data of the item in the connected space viewable from the current viewing angle.

Optionally, the calculation module comprises: a distance calculation module configured to calculate a distance from the at least one item to the current position in the current space according to the position data of the current position and the position data and the information data of the at least one item in the current space; and a first setting module configured to set display priorities in descending order for the information data of the at least one item in the current space according to distances in ascending order.

Optionally, the apparatus further comprises: a second setting module configured to set the display priority of the information data of the at least one item in the current space if a distance from the at least one item to the current position in the current space is less than a preset distance; and a third setting module configured to set the display priority of the information data of the at least one item within the current viewing angle range if definition of the at least one item within the current viewing angle range is higher than preset definition.

Optionally, the information data comprises dimension data of the item; and the distance calculation module comprises: a surface distance calculation module configured to calculate, according to the dimension data and the position data of the at least one item in the current space, calculating position data of a surface of the at least one item in the current space, and determine a shortest straight-line distance from the surface of the at least one item to the current position in the current space as the distance from the at least one item to the current position in the current space; or a central position distance calculation module configured to, according to the dimension data and the position data of the at least one item in the current space, calculate position data of a central position of the at least one item in the current space, and determine a straight-line distance from the central position to the current position as the distance from the at least one item to the current position in the current space.

Optionally, the display priorities comprise first display priorities; and the calculation module comprises: a first distance calculation module configured to calculate, when the information data of the at least one item within the current viewing angle range is obtained, a first distance from the at least one item within the current viewing angle range to the current position according to the position data of the current position and the position data and the information data of the at least one item within the current viewing angle range; and a fourth setting module configured to set first display priorities in descending order for the information data of the at least one item within the current viewing angle range according to first distances in ascending order.

Optionally, the display priority further comprises a second display priority; and the calculation module further comprises: a second distance calculation module configured to calculate, when the information data of the at least one item within the current viewing angle range is obtained, a second distance from the at least one item to the current position beyond the current viewing angle range according to the position data of the current position and the position data and the information data of the at least one item beyond the current viewing angle range; and a fifth setting module configured to set second display priorities in descending order for the information data of the at least one item beyond the current viewing angle range according to second distances in ascending order, wherein the second display priority is lower than the first display priority.

Optionally, the display module comprises: a first display module configured to sequentially display the information data from top to bottom according to the first display priorities when a user views the information data of the at least one item within the current viewing angle range; a second display module configured to sequentially display the information data from top to bottom according to the first display priorities and the second display priorities; or a third display module configured to sequentially display the information data from top to bottom only according to the first display priorities, and in a case that a user views the information data of the at least one item beyond the current viewing angle range, sequentially display the information data from top to bottom according to the second display priorities.

Optionally, the spatial data comprises position data of the current position and current viewing angle data, and the apparatus further comprises: a position changed module configured to update the position data of the current position and current viewing angle data to default position data and default viewing angle data of the changed current position in a case that the current position is changed; and a viewing angle changed module configured to update the current viewing angle data in a case that a current viewing angle is changed.

A third aspect of the present disclosure provides an electronic device, the electronic device comprising: at least one processor, at least one memory, a communication interface, and a bus, wherein the processor, the memory, and the communications interface communicate with one another through the bus; the communications interface is used for information transmission between the electronic device and a communication device of a terminal; and the memory stores program instructions executable by the processor, the processor invoking the program instructions to perform the method described above.

A fourth aspect of the present disclosure provides a non-transitory computer-readable storage medium. The non-transitory computer-readable storage medium stores computer instructions that cause a computer to perform the method described above.

According to the method and apparatus for displaying item information in a current space, the electronic device, and the non-transitory computer-readable storage medium, the display priority of the information data of the at least one item in the current space is calculated through the method, and then the information data of the at least one item in the current space is displayed according to the display priority, so that it is convenient for a user to directly view the information data of the at least one item in the current space.

Embodiments of the present disclosure provide a method and system for viewing item information and an item label in a VR model, and a terminal, wherein by using the method for viewing item information in a VR model, during house viewing through VR by a user, position information and viewing angle information of a virtual observation point in the VR model may be determined, and a displayed observation image may be determined based on the position information and the viewing angle information. Then, a visible item in the observation image may be determined according to the observation image. In response to a point contact on any visible item in the observation image by a user, description information of a corresponding item is provided, so that the user can fully know a simulated decoration scheme and specifically know the detailed description information of each indoor placed item, thereby avoiding a problem that, during house viewing through VR, the user only knows information about an indoor placing position and cannot know information about the placed item.

Embodiments of the present disclosure provide a method for viewing item information in a VR model, the method comprising: determining position information and viewing angle information of a virtual observation point in the VR model, and determining a displayed observation image based on the position information and the viewing angle information; determining a visible item in the observation image according to the observation image; receiving a point contact instruction for any visible item in the observation image; and providing description information of the item in response to the point contact instruction.

Optionally, the description information comprises at least one piece of the following information about the item: dimension information, price information, brand information, and sales information.

Optionally, the method for generating the point contact instruction comprises: generating a direction point based on a point contact position of a user; generating a direction line in a direction of a connecting line between the virtual observation point and the direction point; and generating the point contact instruction for a corresponding object in a case that the direction line intersects a surface of a visible object in the observation image for the first time, wherein the direction point is a spatial coordinate point of the point in a VR scene.

Embodiments of the present disclosure further provide a method for viewing an item label in a VR model, the method comprising: determining position information and viewing angle information of a virtual observation point in the VR model, and determining a displayed observation image based on the position information and the viewing angle information determining a visible item in the observation image according to the observation image; receiving a point contact instruction for a label of any item in the observation image; and in response to the point contact instruction, expanding content in the clicked label.

Optionally, the content in the label comprises at least one piece of the following information: dimension information, price information, brand information, and sales information.

Embodiments of the present disclosure further provide a system for viewing item information in a VR model, the system comprising: a data collection module configured to perform the following operations: determining position information and viewing angle information of a virtual observation point in the VR model; and receiving a point contact instruction for any visible item in the observation image from a user; and a processor configured to perform the following operations: determining a displayed observation image based on the position information and the viewing angle information; determining a visible item in the observation image according to the observation image; receiving the point contact instruction, and providing description information of a corresponding item in response to the point contact instruction.

Optionally, the description information comprises at least one piece of the following information about the item: dimension information, price information, brand information, and sales information.

Optionally, the processor is further configured to: generate a direction point based on a point contact position of a user; generate a direction line in a direction of a connecting line between the virtual observation point and the direction point; and generate the point contact instruction for a corresponding object in a case that the direction line intersects a surface of a visible object in the observation image for the first time, wherein the direction point is a spatial coordinate point of the point in a VR scene.

Embodiments of the present disclosure further provide a system for viewing an item label in a VR model, the system comprising: a data collection module configured to perform the following operations: determining position information and viewing angle information of a virtual observation point in the VR model; and receiving a point contact instruction for a label of any item in the observation image; a processor configured to perform the following operations: determining a displayed observation image based on the position information and the viewing angle information; determining a visible item in the observation image according to the observation image; in response to the point contact instruction, expanding content in the clicked label. Optionally, the content in the label comprises at least one piece of the following information: dimension information, price information, brand information, and sales information.

In another aspect, an embodiment of the present disclosure provides an electronic device, the electronic device comprising: at least one processor, at least one memory, a communication interface, and a bus, wherein the processor, the memory, and the communications interface communicate with one another through the bus; the communications interface is used for information transmission between the electronic device and a communication device of a terminal; and the memory stores program instructions executable by the processor, the processor invoking the program instructions to perform the method for viewing item information in a VR model and/or the method for viewing an item label in a VR model described above.

In another aspect, the present disclosure provides a non-transitory computer-readable storage medium. The non-transitory computer-readable storage medium stores computer instructions that cause a computer to perform the method for viewing item information in a VR model and/or the method for viewing an item label in a VR model described above.

Through the foregoing technical solutions, during house viewing through VR by the user, position information and viewing angle information of the virtual observation point in the VR model may be determined, and the displayed observation image may be determined based on the position information and the viewing angle information. Then, a visible item in the observation image may be determined according to the observation image. The point contact instruction of a user for any visible item in the observation image is received, and in response to the point contact instruction on any visible item in the observation image by the user, description information of a corresponding item may be provided, so that the user can fully know a simulated decoration scheme and specifically know the detailed description information of each indoor placed item, thereby avoiding a problem that, during house viewing through VR, the user only knows information about an indoor placing position and cannot know information about the placed item.

Other features and advantages of the embodiments of the present disclosure will be described in detail in the part of specific implementations.

BRIEF DESCRIPTION OF THE DRAWINGS

In order to describe the technical solutions in the implementations of the present disclosure or in the prior art more clearly, the accompanying drawings to be used in the description of the implementations or the prior art will be briefly described below. Apparently, the accompanying drawings in the following description show some implementations of the present disclosure, and a person skilled in the art may still derive other drawings from these accompanying drawings without creative efforts.

DETAILED DESCRIPTION OF EMBODIMENTS

In order to make the objectives, features, and advantages of the invention more apparent and easier to understand, the following clearly and completely describes the technical solutions in the implementations of the present disclosure with reference to the accompanying drawings in the implementations of the present disclosure. Apparently, the described implementations are some but not all of the implementations of the present disclosure. All other implementations obtained by a person skilled in the art based on the implementations of the present disclosure without any creative effort shall fall within the protection scope of the present disclosure.

Before a detailed description of the content provided by the present disclosure is given, meanings of the concepts of "VR house viewing", "VR house describing", and "VR guided house touring" will be given first. VR (Virtual Reality) means house viewing, house describing, or guided house touring in a virtual three-dimensional space.

Different from the currently popular concept of viewing a house through images or videos or panoramic house viewing, which cannot provide depth information and real perception, "VR house viewing" means that a three-dimensional scene of a house is truly restored with VR technologies, which provides the user with an immersive house viewing experience in a free mode, so that the user can experience the real house viewing scene without being in the house. For example, by opening VR houses on an APP and touching any position on the screen, depth information comprising dimensions, orientations, and distances of the real space of the house can be obtained. In terms of restoring the three-dimensional scene of the house, scanning and video shooting can be first performed on the house at a plurality of points and angles to obtain complete three-dimensional point cloud data, latitude and longitude data, and multi-exposure high-definition color photos. Later, all data and image textures are mapped to a three-dimensional model through three-dimensional reconstruction technologies such as automatic modeling, intelligent hole filling, fully automatic data extraction, and HDR optimization, to obtain a final real house space seen by the user.

"VR house describing" is an audio description service provided by a broker on the basis of "VR house viewing", and the audio description is pre-recorded by the broker according to a roaming route to provide a consumer with a comprehensive description.

"VR guided house touring" is a brand new interactive scene experience. In a VR scene, a user can make a house viewing reservation with the broker, interact with the broker online in real time, and can also add family members and friends anytime and anywhere to complete "guided house touring".

Figure 1:
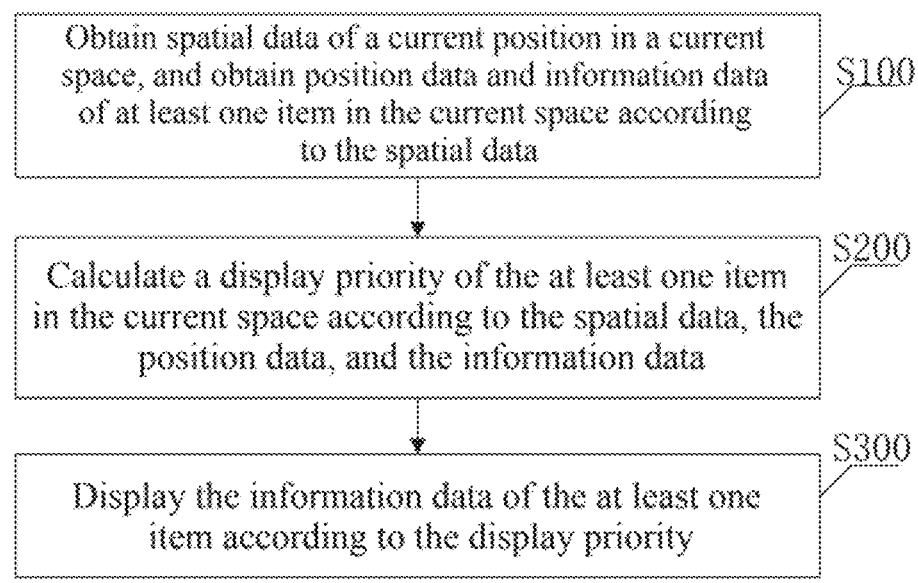
FIG. 1 is a schematic flowchart of a method for displaying item information in a current space according to an implementation 1 of the present disclosure.

FIG. 1 is a schematic flowchart of a method for displaying item information in a current space according to an implementation 1 of the present disclosure.

As shown in FIG. 1, a first aspect of the present disclosure provides a method for displaying item information in a current space, the method comprising the following steps.

S100: Obtaining spatial data of a current position in a current space, and obtaining position data and information data of at least one item in the current space according to the spatial data.

It should be noted that the item information comprises the position data and the information data of an item, that is, both a position of the item in the current space and the information data of the item can be displayed according to the method for displaying item information in the current space provided by the present disclosure.

For the convenience of description, the current space in all the implementations of the present disclosure is a functional room in a house model, and the current position is a position of a camera placed in order to obtain data of the functional room. A height of the camera in each functional room remains unchanged. In order to make it more convenient for a user to view a house, that is, the height of the camera should match the height of the user. Preferably, the height may be set to 1.4-1.8 meters. In order to prevent the user's viewing angle from being too high or too low such that the user cannot view the house and observe the items in the house clearly and completely, the height is preferably set to 1.5 meters or 1.7 meters. The at least one item in the current space comprises at least one piece of furniture such as a bed, a lamp, a cabinet, a hanger, a sofa, a table, a chair and other wood, steel, glass, cloth, plastic articles, and at least one of various appliances such as a TV, an air conditioner, a computer, and the like. Definitely, the at least one item in the current space may further comprise at least one of various life and entertainment products such as clothes, food, books, and the like. the at least one item in the current space may further comprise at least one of various building materials such as a glass window, a wallpaper, wall paint, a door, and the like.

The information data comprises at least one of dimensions, an image, a name, and a selling price of the item, and the method further comprises: popping up a description of the item and a shopping link when a user views the information data, or popping up a shopping interface of the item.

In order to view the information data of the corresponding item more intuitively, the information data of the item may also pop up when the user directly clicks to view the item.

The spatial data comprises the position data of the current position, the current viewing angle data, a current space type, and an overall space type. The current space type may comprise a functional rooms such as a bedroom, a toilet, a kitchen, and the like. The overall space type may be a house type, such as a one-bedroom house, or the like.

S200: Calculating a display priority of the information data of the at least one item in the current space according to the spatial data, the position data, and the information data.

S300: Displaying the information data of the at least one item according to the display priority.

The display priority of the information data may be set or calculated according to the position relationship between the item and the current position. For example, display priorities of the information data are set in descending order according to distances from the items to the current position in ascending order or in descending order.

The display priorities of the information data may alternatively be set according to item categories. Preferably, the display priorities of the items are set according to at least one of an importance level, a decoration order, user preference, the current space type, and the like. For example, the items are classified into building materials, life and entertainment products, kitchen supplies, sanitation supplies, furniture, and appliances, and the like. The display priorities of item categories can be set according to user requirements. For example, if a user needs to redecorate a second-hand house, the display priorities may be set in sequence according to the item category sequence of building materials, furniture, and appliances, and at least one item of building materials, furniture, and appliances is also classified and displayed above each classified item.

If the user needs to renovate the second-hand house, the item category and information data of building materials can be preferentially displayed. If the user only needs to change the furniture, the item category and information data of the furniture and the like are preferentially displayed.

For example, if the current space type is a kitchen, and the kitchen needs to be renovated, the category of building materials will be preferentially displayed, and then an item category of at least one of a cabinet, a refrigerator, cookware, and the like will be displayed in sequence.

Under each item category, the display priorities of items will be set according to at least one of the current space type, user preference, functions, and the distance from the item to the current position.

For example, under the third overall displayed category of electrical items, information data of at least one item of a refrigerator, a microwave oven, an induction cooker, and an exhaust fan may be displayed in sequence according to an importance level, an item size, and distance. Since the refrigerator is the largest and important in function, and even if the refrigerator is at a distance, the user will see and think of the refrigerator first. Therefore, information data of the refrigerator should be preferentially displayed.

Under the fourth overall displayed item category of kitchen products, information data of at least one item of cookware, a gas cooker, a kitchen knife, a cutting board, chopsticks, and porcelain bowls may be displayed in turn according to distances.

Preferably, information data of at least one item within the current viewing angle range is preferentially displayed, so that the user can view the overall layout of items in the current space more intuitively, and then select a collection of items preferred by the user and the overall layout according to the displayed information data.

Figure 2:
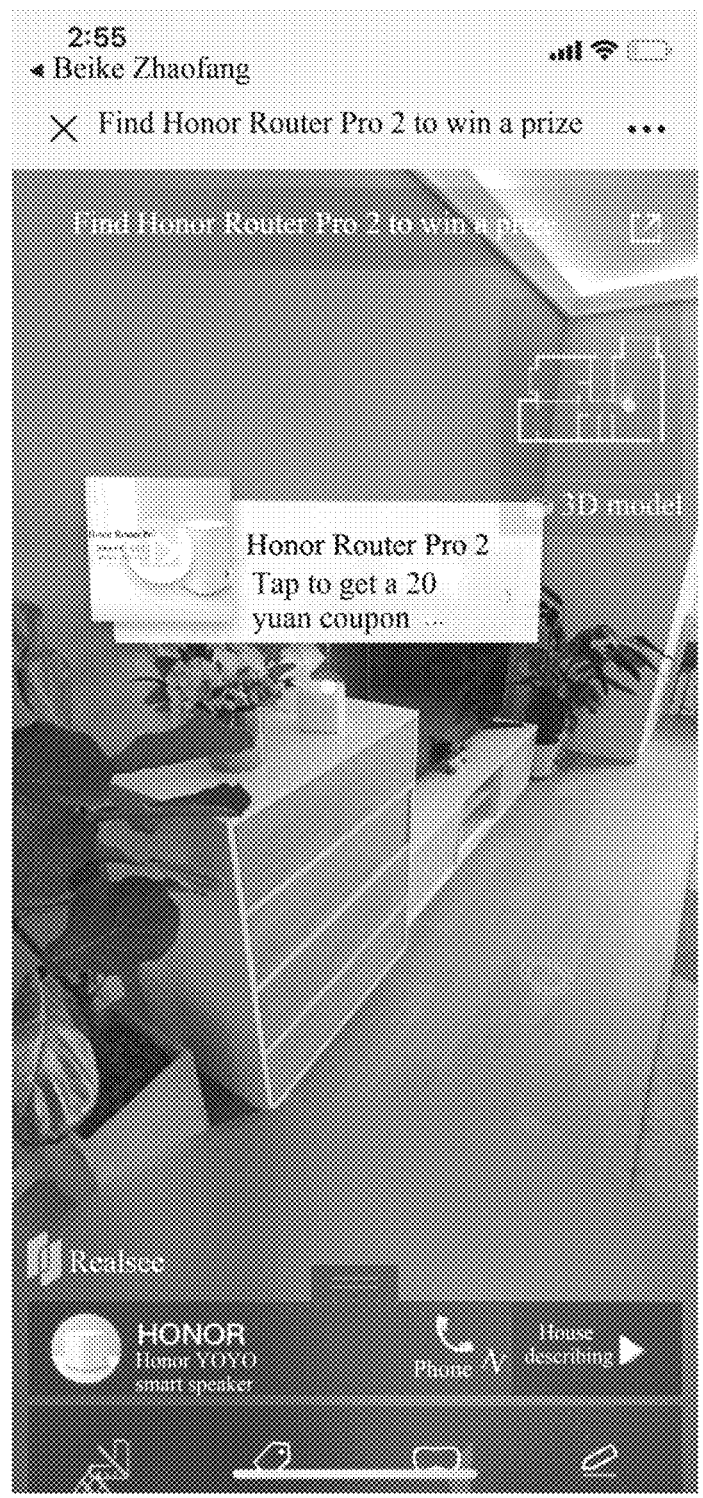
FIG. 2 is a diagram, from a current viewing angle, of a current position of a method for displaying item information in a current space according to an implementation 2 of the present disclosure.

FIG. 2 is a diagram, from a current viewing angle, of a current position of a method for displaying item information in a current space according to an implementation 2 of the present disclosure.

Further, as shown in FIG. 2, spatial data comprises position data of a current position and current viewing angle data.

Step S100 of obtaining spatial data of a current position in a current space, and obtaining position data and information data of at least one item in the current space according to the spatial data comprises the following steps.

S101: Obtaining the position data of the current position and the current viewing angle data in response to a user operation.

S102: Determining a database of the current space according to the position data of the current position.

The database of the current space stores, through pre-recording by a camera, the position data and the information data of the at least one item in the current space.

S103: Obtaining the position data and the information data of the at least one item within a current viewing angle range from the database according to the position data of the current position and the current viewing angle data.

The current viewing angle range comprises the current space.

The spatial data further comprises a name of the current space. Definitely, the spatial data may further comprise at least one of a residential community address, a residential community name, a house number, and the like. The method further comprises: displaying, within the current viewing angle range, the name of the current space in combination with at least one of the residential community address, the residential community name, the house number, and the like; or displaying, above the information data, the name of the current space in combination with at least one of the residential community address, the residential community name, and the house number when the user is viewing the information data.

Further, the current viewing angle range further comprises a connected space, the connected space being in communication with the current space through an opening. Preferably, a transparent object such as glass may be disposed on the opening. Preferably, the opening is a glass door or glass window, or a door frame with the door opened. The at least one item within the current viewing angle range further comprises an item in the connected space viewable from the current viewing angle, and the position data and the information data of the at least one item within the current viewing angle range comprise position data of the item in the connected space viewable from the current viewing angle and information data of the item in the connected space viewable from the current viewing angle.

The method further comprises: obtaining spatial data of the current position, position data of at least one item within a current viewing angle range or at least one item within all current viewing angle ranges, and information data of at least one item within a current viewing angle range or at least one item within all current viewing angle ranges; calculating a display priority of the information data of the at least one item within the current viewing angle range or the at least one item within all the viewing angle ranges according to the spatial data, the position data of at least one item within the current viewing angle range or the at least one item within all the current viewing angle ranges, and the information data of the at least one item within the current viewing angle range or the at least one item within all the current viewing angle ranges; and outputting the information data of the at least one item within all the current viewing angle ranges according to the display priority and a preset rule.

Further, step S200 of calculating a display priority of the information data of at least one item in the current space according to the spatial data, the position data, and the information data comprises the following steps.

S201: Calculating a distance from the at least one item to a current position in the current space according to the position data of the current position and the position data and the information data of the at least one item in the current space.

S202: Setting display priorities in descending order for the information data of the at least one item in the current space according to distances in ascending order.

Further, the method further comprises the following steps.

S400: Setting the display priority of the information data of the at least one item in the current space if a distance from the at least one item to the current position in the current space is less than a preset distance, and when the distance is greater than the preset distance, skipping setting the display priority of the information data, that is, skipping displaying the information data. If the current space is too large, or the shape is too narrow and long, or there is a blind spot of viewing angle, there may be a plurality of video recording points in a single current space, that is, a plurality of current positions. The preset distance may be set to 6-10 meters. Since the distance from the item to the current position are too long, the user cannot clearly and carefully observe the layout and details of items in the current space. Preferably, the preset distance may be set to 5 meters or less than 5 meters.

Preferably, a display priority of information data may not be set for an item outside the current space, for example, trees outside the window, and the like.

Definitely, a display priority of information data may be set for the air-conditioning cabinet hung outside the window or an item within a close range visible in another connected space.

S500: Setting the display priority of the information data of the at least one item within the current viewing angle range if definition of the at least one item within the current viewing angle range is higher than preset definition, and if the definition is lower than the preset definition, skipping setting the display priority of the information data, that is, skipping displaying the information data.

An item viewed completely through frosted glass may be regarded as invisible, and information data of the item behind the frosted glass is not displayed. However, information data can be displayed on the frosted glass.

In a case of dim light, if the overall outline of the item is visible, the information data can also be displayed.

Further, the information data comprises dimension data of the item.

Step S201 of calculating a distance from the at least one item to a current position in the current space according to the position data of the current position and the position data and the information data of the at least one item in the current space comprises:

S211: According to the dimension data and position data of the at least one item in the current space, calculating position data of a surface of the at least one item in the current space, and determining a shortest straight-line distance from the surface of the at least one item to the current position in the current space as the distance from the at least one item to the current position in the current space; or S212: According to the dimension data and the position data of the at least one item in the current space, calculating position data of a central position of the at least one item in the current space, and determining a straight-line distance from the central position to the current position as the distance from the at least one item to the current position in the current space.

Further, the display priority comprises a first display priority.

Step S200 of calculating a display priority of at least one item in the current space according to the spatial data, the position data, and the information data comprises the following steps.

S203: When the information data of the at least one item within a current viewing angle range is obtained, calculating a first distance from the at least one item within the current viewing angle range to the current position according to the position data of the current position and the position data and the information data of the at least one item within the current viewing angle range.

S204: Setting first display priorities in descending order for the information data of the at least one item within the current viewing angle range according to first distances in ascending order.

Further, the display priority further comprises a second display priority.

Step S200 of calculating a display priority of at least one item in the current space according to the spatial data, the position data, and the information data further comprises the following steps.

S205: When the information data of the at least one item within a current viewing angle range is obtained, calculating a second distance from at least one item beyond the current viewing angle range to the current position according to the position data of the current position and position data and information data of the at least one item beyond the current viewing angle range.

S206: Setting second display priorities in descending order for the information data of the at least one item beyond the current viewing angle range according to second distances in ascending order.

The second display priority is lower than the first display priority. That is, the information data of the at least one item within the current viewing angle range is preferentially displayed.

Figure 3:
FIG. 3 is a diagram of displaying information data of a method for displaying item information in a current space according to an implementation 3 of the present disclosure.

FIG. 3 is a diagram of displaying information data of a method for displaying item information in a current space according to an implementation 3 of the present disclosure.

Further, as shown in FIG. 3, step S300 of displaying the information data of the at least one item in the current space according to the display priority comprises:

S301: Sequentially displaying information data from top to bottom according to first display priorities when a user views the information data of the at least one item within a current viewing angle range;

S302: Sequentially displaying the information data from top to bottom according to the first display priorities and second display priorities; or S303: Sequentially displaying the information data from top to bottom only according to the first display priorities, and in a case that the user views the information data of the at least one item beyond the current viewing angle range, sequentially displaying the information data from top to bottom according to the second display priorities.

Preferably, the information data of at least one item is displayed in the form of a list on a display interface of the current viewing angle range.

Further, the spatial data comprises position data of the current position and current viewing angle data, and the method further comprises the following steps.

S600: Updating the position data of the current position and the current viewing angle data to default position data and default viewing angle data of the changed current position in a case that the current position is changed.

S700: Updating the current viewing angle data in a case that a current viewing angle is changed.

When the user selects or changes the current position, the default position and the default viewing angle may be selected as a position of the door and a viewing angle from the door. The user can change the current viewing angle in all directions such as up and down, left and right, front and back.

Figure 4:
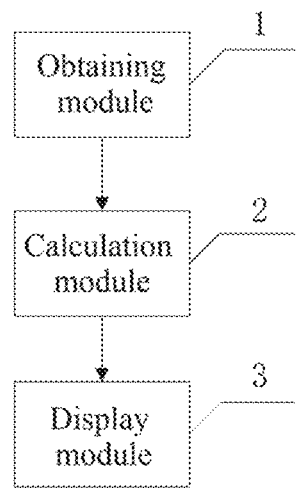
FIG. 4 is a schematic structural diagram of an apparatus for displaying item information in a current space according to an implementation 4 of the present disclosure.

FIG. 4 is a schematic structural diagram of an apparatus for displaying item information in a current space according to an implementation 4 of the present disclosure.

As shown in FIG. 4, a second aspect of the present disclosure further provides an apparatus for displaying item information in a current space, the apparatus comprising: an obtaining module 1 configured to obtain spatial data of a current position in the current space, and obtain position data and information data of at least one item in the current space according to the spatial data; a calculation module 2 configured to calculate a display priority of the at least one item in the current space according to the spatial data, the position data, and the information data; and a display module 3 configured to display the information data of the at least one item according to the display priority.

Further, the spatial data comprises position data of the current position and current viewing angle data.

The obtaining module 1 comprises: a first obtaining module 11 configured to obtain the position data of the current position and the current viewing angle data in response to a user operation; a database determining module 12 configured to determine a database of the current space according to the position data of the current position; and a second obtaining module 13 configured to obtain the position data and the information data of the at least one item within a current viewing angle range from the database according to the position data of the current position and the current viewing angle data.

The current viewing angle range comprises the current space.

Further, the current viewing angle range further comprises a connected space, the connected space being in communication with the current space through an opening.

The at least one item within the current viewing angle range further comprises an item in the connected space viewable from the current viewing angle, and the position data and the information data of the at least one item within the current viewing angle range comprise position data of the item in the connected space viewable from the current viewing angle and information data of the item in the connected space viewable from the current viewing angle.

Further, the calculation module 2 comprises: a distance calculation module 21 configured to calculate a distance from the at least one item to a current position in the current space according to the position data of the current position and the position data and the information data of the at least one item in the current space; and a first setting module 22 configured to set display priorities in descending order for the information data of the at least one item in the current space according to distances in ascending order.

Further, the apparatus further comprises: a second setting module 4 configured to set the display priority of the information data of the at least one item in the current space if a distance from the at least one item to the current position in the current space is less than a preset distance; and a third setting module 5 configured to set the display priority of the information data of the at least one item within the current viewing angle range if definition of the at least one item within the current viewing angle range is higher than preset definition.

Further, the information data comprises dimension data of the item.

The distance calculation module 21 comprises: a surface distance calculation module 211 configured to: according to the dimension data and position data of the at least one item in the current space, calculate position data of a surface of the at least one item in the current space, and determine a shortest straight-line distance from the surface of the at least one item to the current position in the current space as the distance from the at least one item to the current position in the current space; or a central position distance calculation module 212 configured to: according to the dimension data and the position data of the at least one item in the current space, calculate position data of a central position of the at least one item in the current space, and determine a straight-line distance from the central position to the current position as the distance from the at least one item to the current position in the current space.

Further, the display priority comprises a first display priority.

The calculation module 2 further comprises: a first distance calculation module 23 configured to calculate, when the information data of the at least one item within a current viewing angle range is obtained, a first distance from the at least one item within the current viewing angle range to the current position according to the position data of the current position and the position data and the information data of the at least one item within the current viewing angle range; and a fourth setting module 24 configured to set first display priorities in descending order for the information data of the at least one item within the current viewing angle range according to first distances in ascending order.

Further, the display priority further comprises a second display priority.

The calculation module 2 further comprises: a second distance calculation module 25 configured to calculate, when the information data of the at least one item within a current viewing angle range is obtained, a second distance from at least one item beyond the current viewing angle range to the current position according to the position data of the current position and the position data and the information data of the at least one item beyond the current viewing angle range; and a fifth setting module 26 configured to set second display priorities in descending order for the information data of the at least one item beyond the current viewing angle range according to second distances in ascending order.

The second display priority is lower than the first display priority.

Further, the display module 3 comprises: a first display module 31 configured to sequentially display information data from top to bottom according to the first display priorities when a user views the information data of the at least one item within the current viewing angle range; a second display module 32 configured to sequentially display the information data from top to bottom according to the first display priorities and the second display priorities; or a third display module 33 configured to sequentially display the information data from top to bottom only according to the first display priorities, and in a case that the user views the information data of the at least one item beyond the current viewing angle range, sequentially display the information data from top to bottom according to the second display priorities.

Further, the spatial data comprises position data of the current position and current viewing angle data, and the apparatus further comprises: a position changed module 6 configured to update the position data of the current position and current viewing angle data to default position data and default viewing angle data of the changed current position in a case that the current position is changed; and a viewing angle changed module 7 configured to update the current viewing angle data in a case that a current viewing angle is changed.

The working principle and beneficial effects of the apparatus for displaying item information in a current space provided in the second aspect of the present disclosure are the same as those of the above method for displaying item information in a current space, and details are not described herein again.

Figure 5:
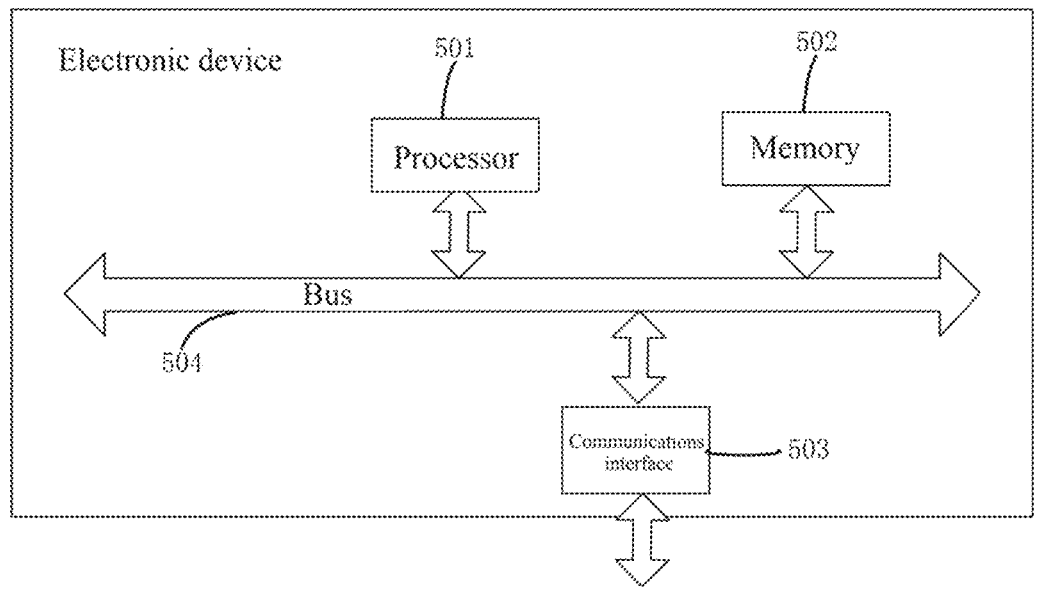
FIG. 5 is a structural block diagram of an electronic device according to an implementation 5 of the present disclosure.

FIG. 5 is a structural block diagram of an electronic device according to an implementation 5 of the present disclosure.

As shown in FIG. 5, a third aspect of the present disclosure further provides an electronic device, the electronic device comprising: a processor 501, a memory 502, a communications interface 503, and a bus 504.

The processor 501, the memory 502, and the communications interface 503 communicate with one another through the bus 504.

The communications interface 503 is used for information transmission between the electronic device and a communication device of a terminal.

The processor 501 is configured to invoke program instructions in the memory 502 to perform the method provided in the method embodiments described above.

A fourth aspect of the present disclosure further provides a non-transitory computer-readable storage medium. The non-transitory computer-readable storage medium stores computer instructions that cause a computer to perform the method provided in the method embodiments described above.

The present embodiment discloses a computer program product. The computer program product comprises a computer program stored on a non-transitory computer-readable storage medium. The computer program comprises program instructions that, when executed by a computer, cause the computer to perform the method provided in the method embodiments described above.

According to the method and apparatus for displaying item information in a current space, the electronic device, and the non-transitory computer-readable storage medium, the display priority of the information data of the at least one item in the current space is calculated through the method, and then the information data of the at least one item in the current space is displayed according to the display priority, so that it is convenient for a user to directly view the information data of the at least one item in the current space.

Those of ordinary skill in the art may understand that all or a part of the steps for implementing the above method embodiments may be completed through a program that instructs related hardware. The program may be stored in a computer-readable storage medium. When the program is executed, the steps comprising the above method embodiments are performed. The above storage medium comprises: various media such as a ROM, a RAM, a magnetic disk, an optical disk, or the like that can store program code.

The embodiments of the electronic device described above are merely schematic, wherein units illustrated as separate components can be or cannot be physically separated, and the components illustrated as units can be or cannot be physical units. That is to say, the components can be positioned at one place or distributed on a plurality of network units. The object(s) of solutions of embodiments can be achieved by selecting some or all of the modules therein according to actual needs. Those of ordinary skill in the art can understand and implement the solutions without any creative effort.

Through the description of the above implementations, those skilled in the art can clearly understand that the implementations can be implemented by software and necessary general hardware platforms. Definitely, the implementations can also be implemented by hardware. Based on such understanding, the above technical solutions substantially, or the part (s) thereof making contributions to the prior art, can be embodied in the form of a software product. The computer software product can be stored in a computer-readable storage medium such as a ROM/RAM, a magnetic disk, or an optical disk, which comprises several instructions to enable a computer device (which can be a personal computer, a server, a network device, or the like) to perform the methods in embodiments or parts of the embodiments.

With the development of VR technologies, not only the houses in the actual physical space can be used in this way, but also the user can choose a simulated decoration scheme of a room through VR house viewing, which can realize the simulation of house decoration effect in a VR scene. However, detailed information of the items placed in the room in the simulated decoration scheme is still unknown. For example, in the simulated decoration scheme, a 65-inch TV is placed in the living room, but the user cannot know detailed parameters and market price information of the TV in the VR scene, and therefore the user cannot know detailed information of the items placed in the room in the simulated decoration scheme through VR house viewing. Therefore, there is a requirement for making the user view the information data of the corresponding item more intuitively, so that the information data of the item can pop up when the user directly clicks the item for viewing.

Detailed implementations of the embodiments of the present disclosure are described in detail below with reference to the accompanying drawings. It should be understood that the specific implementations described herein are merely used to describe and explain the embodiments of the present disclosure, which are not used to limit the embodiments of the present disclosure.

Figure 6:
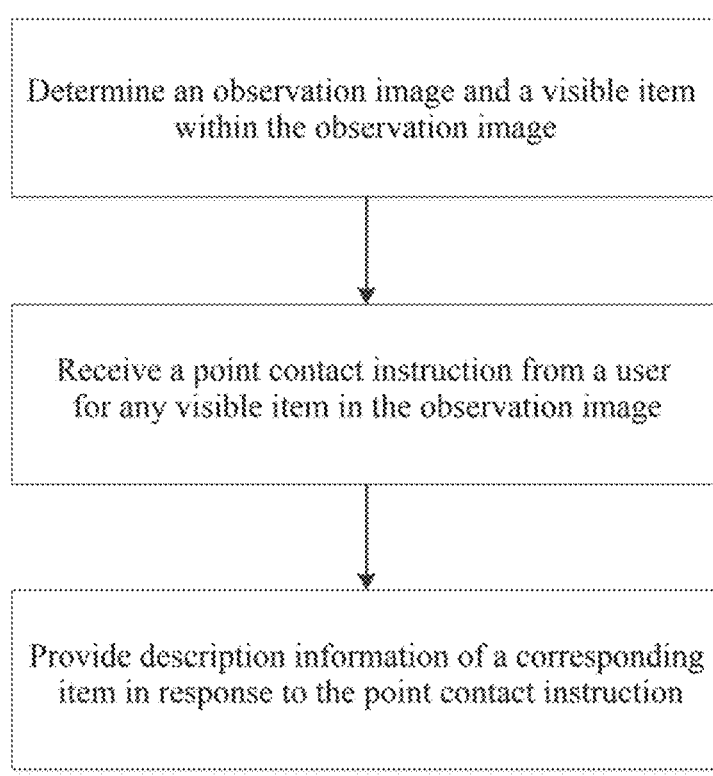
FIG. 6 is a schematic flowchart of a method for viewing item information in a VR model according to an embodiment of the present disclosure.

FIG. 6 is a basic schematic flowchart of a method for viewing item information in a VR model according to an embodiment of the present disclosure. As shown in FIG. 6, the method comprises:

S11: Determining position information and viewing angle information of a virtual observation point in the VR model, and determining a displayed observation image based on the position information and the viewing angle information;

S12: Determining a visible item in the observation image according to the observation image;

S13: Receiving a point contact instruction for any visible item in the observation image; and S14: Providing description information of the item in response to the point contact instruction.

During house viewing through VR, the user can have an immersive house viewing experience at home, and can also view the simulated decoration effect of the house based on the VR house viewing technology, which can also make the customer have an immersive experience for the simulated decoration effect. During house viewing through VR by the user, every time a virtual observation point moves, the corresponding observation image changes accordingly, and after the observation image changes, the visible items in the image also change accordingly. Specifically, by determining position information and viewing angle information of the virtual observation point in the VR model, a displayed observation image can be determined based on the position information and the viewing angle information. A position of the virtual observation point in the VR model can be considered as the position of the user in the room. The viewing angle of the virtual observation point in the VR model can be considered as a visual direction of the user during observation in the room. Due to a limited visual angle, an image observed from an observation angle at a point in the room is a fixed range of an area. In a pre-stored VR model, the corresponding observation image can be determined according to the position of the virtual observation point in the VR model and the viewing angle of the virtual observation point in the VR model, and the visible item in the observation image can be determined according to the determined observation image. In order to further know the detailed information of the items placed in the room in the simulated decoration scheme, the user can click any visible item in the observation image, for example, click the sofa in the observation image to further know specific information of the sofa. Specifically, according to the method, a point contact instruction for any visible item in the observation image can be received from the user, and description information of the corresponding item can be provided in response to the point contact instruction, so that the user can know the detailed description information of the items placed in each room in the simulated decoration scheme while learning the simulated decoration effect during house viewing through VR.

For the method for viewing item information in a VR model provided in the embodiment of the present disclosure, the description information comprises at least one piece of the following information about the item: dimension information, price information, brand information, and sales information.

The description information about the item may comprise at least one piece of the following information: dimension information, price information, brand information, and sales information. For example, when the user clicks the sofa in the observation image, brand information, material information, internal structure information, dimension information, and market price information of the sofa are provided, so that the user can know the above parameter information and price information of each item while knowing the positions of the items in the simulated decoration scheme, which can provide more decisive factors for the user to choose from a plurality of simulated decoration schemes.

For the method for viewing item information in a VR model provided in the embodiment of the present disclosure, the method for generating a point contact instruction comprises:

S131: Generating a direction point based on a point contact position of a user;

S132: Generating a direction line in a direction of a connecting line between the virtual observation point and the direction point; and S133: Generating a point contact instruction for a corresponding object in a case that the direction line intersects a surface of a visible object in the observation image for the first time, wherein the direction point is a spatial coordinate point of the point in a VR scene.

For an observation image, the user clicks an item on the observation image, and a direction point can be generated based on the point contact position of the user. The direction point is a spatial coordinate point in the VR model. In the pre-stored VR model, based on user control, the spatial coordinate position of the virtual observation point in the VR model can be determined after each movement, and the spatial coordinate position of the items placed in each room in the VR model in the pre-stored simulated decoration scheme can also be determined. A direction line is generated in a direction of a connecting line between the virtual observation point and the direction point. When the direction line intersects the surface of a visible object in the observation image for the first time, a point contact instruction for the corresponding object is generated, that is, when the spatial coordinates of a point on the direction line intersect the spatial coordinates of an object in the observation image for the first time, the item clicked by the user can be determined, then the point contact instruction for the item can be generated, and the description information of the corresponding item can be provided to the user according to the point contact instruction.

Figure 7:
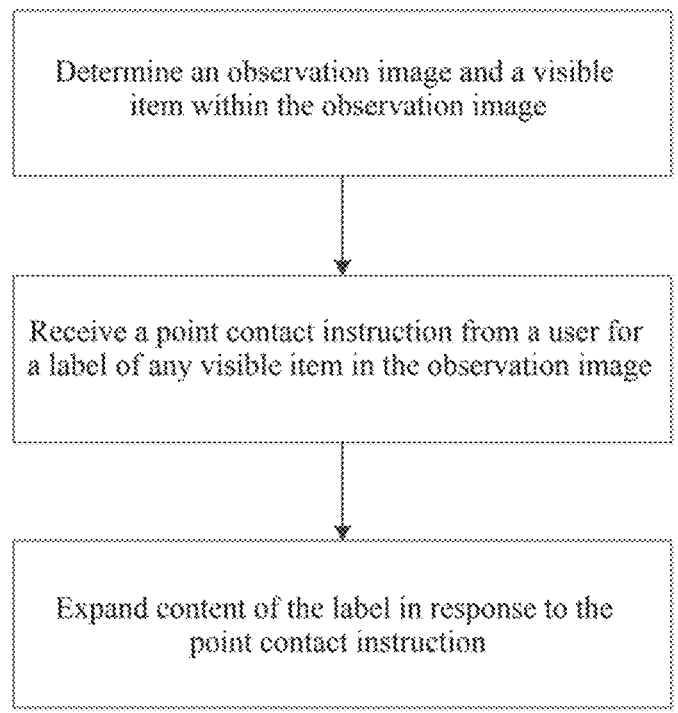
FIG. 7 is a schematic flowchart of a method for viewing an item label in a VR model according to an embodiment of the present disclosure.

FIG. 7 is a schematic flowchart of a method for viewing an item label in a VR model according to an embodiment of the present disclosure. As shown in FIG. 7, the method for viewing an item label in a VR model comprises: determining position information and viewing angle information of a virtual observation point in the VR model, and determining a displayed observation image based on the position information and the viewing angle information; determining a visible item in the observation image according to the observation image; and receiving a point contact instruction for a label of any item in the observation image; and in response to the point contact instruction, expanding content in the clicked label.

During house viewing through VR by the user, every time a virtual observation point moves, the corresponding observation image changes accordingly, and after the observation image changes, the visible items in the image also change accordingly. Specifically, by determining position information and viewing angle information of the virtual observation point in the VR model, a displayed observation image can be determined based on the position information and the viewing angle information. A position of the virtual observation point in the VR model can be considered as the position of the user in the room. The viewing angle of the virtual observation point in the VR model can be considered as a visual direction of the user during observation in the room. Due to a limited visual angle, an image observed from an observation angle at a point in the room is a fixed range of an area. In a pre-stored VR model, the corresponding observation image can be determined according to the position of the virtual observation point in the VR model and the viewing angle of the virtual observation point in the VR model, and the visible item in the observation image can be determined according to the determined observation image. In order to further know the detailed information of the items placed in the room in the simulated decoration scheme, the user can click a label of any visible item in the observation image, for example, click the label of the sofa in the observation image to further know specific information of the sofa. Specifically, according to the method, a point contact instruction for a label of any visible item in the observation image can be received from the user, and description information of the corresponding item is provided in response to the point contact instruction, so that the user can know the detailed description information of the items placed in each room in the simulated decoration scheme while learning the simulated decoration effect during house viewing through VR.

For the method for viewing an item label in a VR model provided in the embodiment of the present disclosure, the content in the label comprises at least one piece of the following information about the item: dimension information, price information, brand information, and sales information.

The label content about the item may comprise at least one piece of the following information: dimension information, price information, brand information, and sales information. For example, when the user clicks the label of the sofa in the observation image, brand information, material information, internal structure information, dimension information, and market price information of the sofa are provided, so that the user can know the above information of each item while knowing the positions of the items in the simulated decoration scheme, which can provide more decisive factors for the user to choose from a plurality of simulated decoration schemes.

Figure 8:
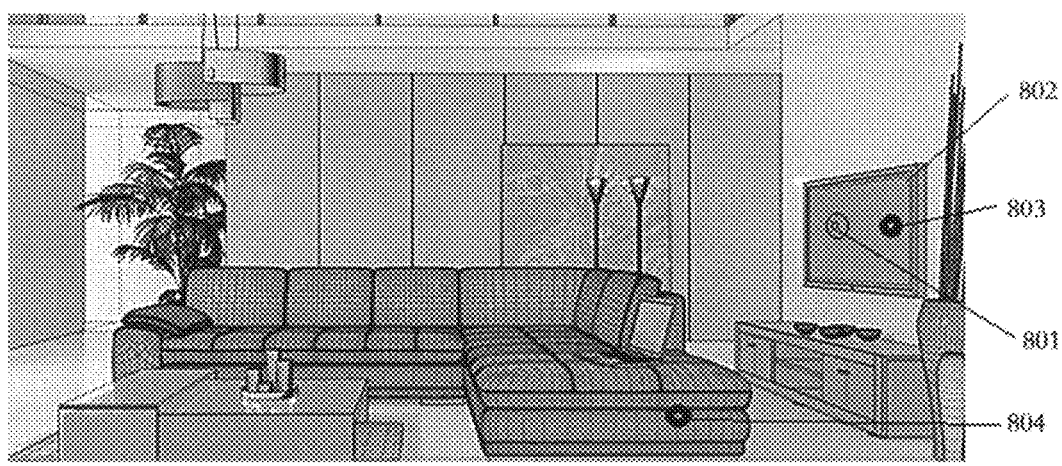
FIG. 8 is a diagram of displaying an observation image of a living room in a VR model according to an embodiment of the present disclosure.
Figure 9:
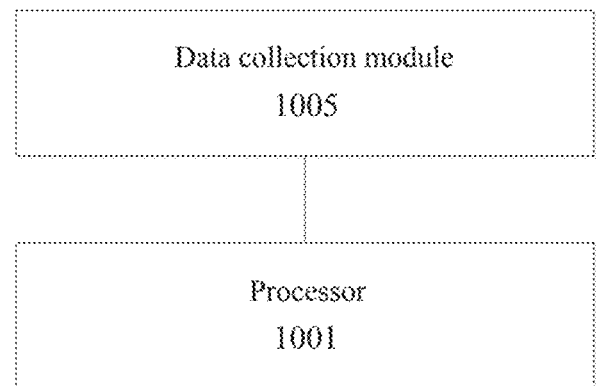
FIG. 9 is a structural flowchart of a system for viewing item information in a VR model according to an embodiment of the present disclosure.

FIG. 8 is a diagram of displaying an observation image of a living room based on VR according to an embodiment of the present disclosure. As shown in FIG. 9, position information and viewing angle information of a virtual observation point in the VR model may be first determined after the virtual observation point moves, and a displayed observation image may be determined based on the position information and the viewing angle information. Then, a visible item in the observation image may be further determined according to the determined observation image. According to the position information and viewing angle information of the virtual observation point in the VR model, the observation image is determined as an observation image of the virtual observation point at a position in the living room. During the observation, if having a desire to know description information of the TV placed in the living room, the user clicks the TV 802 on the observation image, a direction point is generated based on the point contact position 801 of the user, and a direction line is generated in a direction of a connecting line between the current virtual observation point and the direction point. When it is determined that the spatial coordinates of a point on the direction line fall on the screen surface of the TV 802, a point contact instruction for the TV 802 is generated, and the description information of the TV 802 is provided in response to the point contact instruction for the TV 802, which are specifically shown in the following table.

TABLE 1

| | |
|---|---|
| TV brand | Xiaomi |
| Reference price | 3499 |
| Aspect ratio | 16:9 |
| Backlight | LED |
| Screen resolution | UHD 4K |
| Screen size | 65 inches |
| Product color | Golden |

According to another embodiment of the present disclosure, first, position information and viewing angle information of a virtual observation point in the VR model may be determined after the virtual observation point moves, and a displayed observation image is determined based on the position information and the viewing angle information. Then, a visible item in the observation image may be further determined according to the determined observation image. According to the position information and the viewing angle information of the virtual observation point in the VR model, the observation image is determined as an observation image of the virtual observation point at a position in the living room. During the observation, if having a desire to know description information of the TV placed in the living room, the user clicks the TV label 803 on the observation image, and in response to the point contact instruction for the TV label 803, the label content of the TV label 803 is expanded, which are specifically shown as in Table 1 above.

FIG. 9 is a structural flowchart of a system for viewing item information in a VR model of an embodiment of the present disclosure. As shown in FIG. 9, the system for viewing item information in a VR model comprises: a data collection module configured to perform the following operations: determining position information and viewing angle information of a virtual observation point in the VR model; and receiving a point contact instruction for any visible item in the observation image from a user; and a processor configured to perform the following operations: determining a displayed observation image based on the position information and the viewing angle information; determining a visible item in the observation image according to the observation image; and receiving the point contact instruction, and providing description information of a corresponding item in response to the point contact instruction.

The system may comprise a data collection module and a processor. During the VR house viewing by the user, every time the virtual observation point moves, the corresponding observation image changes, and after the observation image changes, the visible item in the image also change accordingly. Specifically, the data collection module may be used to obtain position information of the virtual observation point in the VR model in real time, and obtain the viewing angle information of the virtual observation point in the VR model in real time. A position of the virtual observation point in the VR model can be considered as the position of the user in the room. The viewing angle of the virtual observation point in the VR model can be considered as a visual direction of the user during observation in the room. Due to a limited visual angle, an image observed from an observation angle at a point in the room is a fixed range of an area. In pre-stored VR scene data, the processor may determine a corresponding observation image according to the position information of the virtual observation point in the VR model and the viewing angle information of the virtual observation point in the VR model, and further determine the visible item in the observation image according to the determined observation image. During house viewing through VR, the user can have an immersive house viewing experience at home, and can also view the simulated decoration effect of the house based on the VR house viewing technology, which can also make the customer have an immersive experience for the simulated decoration effect. In order to further know the detailed information of the items placed in the room in the simulated decoration scheme, the user can click any visible item in the observation image, for example, click the sofa in the observation image to further know specific information of the sofa. The data collection module is configured to receive the point contact instruction for the sofa in the observation image from the user, and the processor is configured to provide the description information of the corresponding item in response to the point contact instruction, so that the user can know the detailed description information of the items placed in each room in the simulated decoration scheme while learning the simulated decoration effect during house viewing through VR.

For the system for viewing item information in a VR model provided in the embodiment of the present disclosure, the description information comprises at least one piece of the following information about the item: dimension information, price information, brand information, and sales information.

The description information about the item may comprise at least one piece of the following information: dimension information, price information, brand information, and sales information. For example, when the user clicks the sofa in the observation image, brand information, material information, internal structure information, dimension information, and market price information of the sofa are provided, so that the user can know the above parameter information and price information of each item while knowing the positions of the items in the simulated decoration scheme, which can provide more decisive factors for the user to choose from a plurality of simulated decoration schemes.

For the system for viewing item information in a VR model provided in the embodiment of the present disclosure, the processor is further configured to perform the following operations: generating a direction point based on a point contact position of a user; generating a direction line in a direction of a connecting line between the virtual observation point and the direction point; and generating the point contact instruction for a corresponding object in a case that the direction line intersects a surface of a visible object in the observation image for the first time, wherein the direction point is a spatial coordinate point of the point in a VR scene.

For an observation image, the user clicks an item on the observation image, and the processor may generate a direction point based on the point contact position of the user. The direction point is a spatial coordinate point in the VR model. In the pre-stored VR model, based on user control, the spatial coordinate position of the virtual observation point in the VR model can be determined after each movement, and the spatial coordinate position of the items placed in each room in the VR model in the pre-stored simulated decoration scheme can also be determined. A direction line is generated in a direction of a connecting line between the virtual observation point and the direction point. When the direction line intersects the surface of a visible object in the observation image for the first time, the processor generates the point contact instruction for the corresponding object, that is, when the spatial coordinates of a point on the direction line intersect the spatial coordinates of an object in the observation image for the first time, the item clicked by the user can be determined, then the point contact instruction for the item can be generated, and the description information of the corresponding item can be provided to the user according to the point contact instruction.

For the system for viewing an item label in a VR model provided in an embodiment of the present disclosure, the system comprises: a data collection module configured to perform the following operations: determining position information and viewing angle information of a virtual observation point in the VR model; and receiving a point contact instruction for a label of any item in the observation image; a processor configured to perform the following operations: determining a displayed observation image based on the position information and the viewing angle information; determining a visible item in the observation image according to the observation image; and in response to the point contact instruction, expanding content in the clicked label.

During the VR house viewing by the user, every time the virtual observation point moves, the corresponding observation image changes, and after the observation image changes, the visible item in the image also change accordingly. Specifically, the data collection module may be used to obtain position information of the virtual observation point in the VR model in real time, and obtain the viewing angle information of the virtual observation point in the VR model in real time. A position of the virtual observation point in the VR model can be considered as the position of the user in the room. The viewing angle of the virtual observation point in the VR model can be considered as a visual direction of the user during observation in the room. Due to a limited visual angle, an image observed from an observation angle at a point in the room is a fixed range of an area. In pre-stored VR scene data, the processor may determine a corresponding observation image according to the position information of the virtual observation point in the VR model and the viewing angle information of the virtual observation point in the VR model, and further determine the visible item in the observation image according to the determined observation image. During house viewing through VR, the user can have an immersive house viewing experience at home, and can also view the simulated decoration effect of the house based on the VR house viewing technology, which can also make the customer have an immersive experience for the simulated decoration effect. In order to further know the detailed information of the items placed in the room in the simulated decoration scheme, the user can click a label of any visible item in the observation image, for example, click a label 804 of the sofa in the observation image to further know specific information of the sofa. The data collection module is configured to receive the point contact instruction for the sofa label 804 in the observation image from the user, and the processor is configured to expand the content in the sofa label 804 in response to the point contact instruction, so that the user can know the detailed description information of the items placed in each room in the simulated decoration scheme while learning the simulated decoration effect during house viewing through VR.

For the system for viewing an item label in a VR model provided in the embodiment of the present disclosure, the content in the label comprises at least one piece of the following information about the item: dimension information, price information, brand information, and sales information.

The label content about the item may comprise at least one piece of the following information: dimension information, price information, brand information, and sales information. For example, when the user clicks the sofa in the observation image, brand information, material information, internal structure information, dimension information, and market price information of the sofa are provided, so that the user can know the above parameter information and price information of each item while knowing the positions of the items in the simulated decoration scheme, which can provide more decisive factors for the user to choose from a plurality of simulated decoration schemes.

The method provided in the present embodiment is usually performed by a terminal such as a mobile phone or a computer, which is not specifically limited in the present embodiment. The terminal is comprised in the above system for viewing indoor item information based on VR, and the user can perform VR house viewing and know the simulated decoration scheme by holding the terminal. Specifically, any visible item on the observation image can be clicked on a screen of the mobile phone, that is, a point contact instruction for any visible item in the observation image is received from the user. In response to the instruction, the description information of the item clicked by the user can be selectively displayed in any area of the terminal screen.

Figure 10:
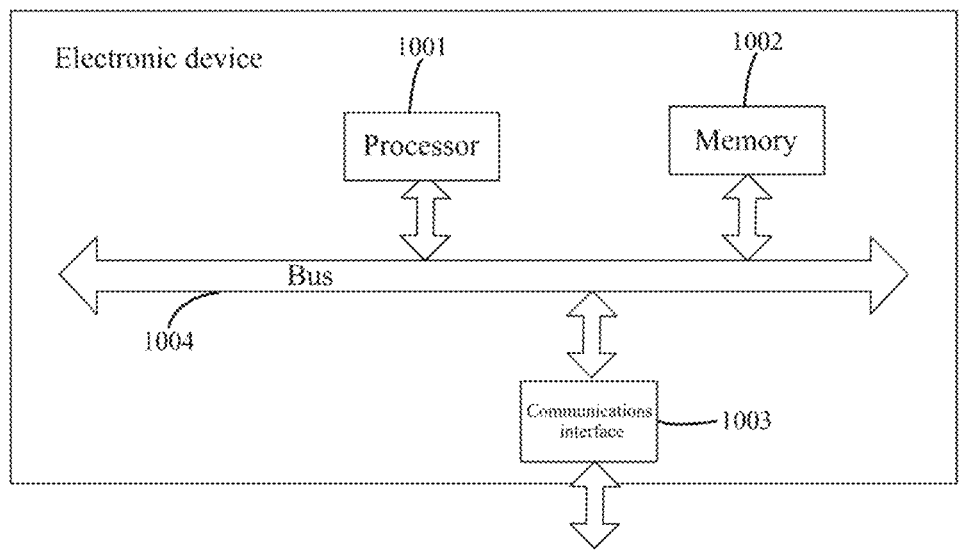
FIG. 10 is a structural block diagram of an electronic device according to an embodiment of the present disclosure.

FIG. 10 is a structural block diagram of an electronic device according to an embodiment of the present disclosure.

Referring to FIG. 10, the electronic device comprises: a processor 1001, a memory 1002, a communications interface 1003, and a bus 1004, wherein the processor 1001, the memory 1002, and the communications interface 1003 communicate with one another through the bus 1004.

The communications interface 1003 is used for information transmission between the electronic device and a communication device of a terminal.

The processor 1001 is configured to invoke program instructions in the memory 1002 to perform the method provided in the various method embodiments described above. For example, the method comprises: determining position information and viewing angle information of a virtual observation point in the VR model, and determining a displayed observation image based on the position information and the viewing angle information; determining a visible item in the observation image according to the observation image; and receiving a point contact instruction for any visible item in the observation image; providing description information of the item in response to the point contact instruction; generating a direction point based on a point contact position of a user; generating a direction line in a direction of a connecting line between the virtual observation point and the direction point; generating the point contact instruction for a corresponding object in a case that the direction line intersects a surface of a visible object in the observation image for the first time, wherein the direction point is a spatial coordinate point of the point in a VR scene; determining position information and viewing angle information of a virtual observation point in the VR model, and determining a displayed observation image based on the position information and the viewing angle information; determining a visible item in the observation image according to the observation image; receiving a point contact instruction for a label of any item in the observation image; in response to the point contact instruction, expanding content in the clicked label. The content in the label comprises at least one piece of the following information: dimension information, price information, brand information, and sales information.

The present embodiment provides a non-transitory computer-readable storage medium. The non-transitory computer-readable storage medium stores computer instructions that cause a computer to perform the method provided in the method embodiments described above. For example, the method comprises: determining position information and viewing angle information of a virtual observation point in the VR model, and determining a displayed observation image based on the position information and the viewing angle information; determining a visible item in the observation image according to the observation image; receiving a point contact instruction for any visible item in the observation image; providing description information of the item in response to the point contact instruction; generating a direction point based on a point contact position of a user; generating a direction line in a direction of a connecting line between the virtual observation point and the direction point; generating the point contact instruction for a corresponding object in a case that the direction line intersects a surface of a visible object in the observation image for the first time, wherein the direction point is a spatial coordinate point of the point in a VR scene; determining position information and viewing angle information of a virtual observation point in the VR model, and determining a displayed observation image based on the position information and the viewing angle information; determining a visible item in the observation image according to the observation image; receiving a point contact instruction for a label of any item in the observation image; in response to the point contact instruction, expanding content in the clicked label. The content in the label comprises at least one piece of the following information: dimension information, price information, brand information, and sales information.

The present embodiment discloses a computer program product. The computer program product comprises a computer program stored on a non-transitory computer-readable storage medium. The computer program comprises program instructions that, when executed by a computer, cause the computer to perform the method provided in the method embodiments described above.

The foregoing describes optional implementations of the embodiments of the present disclosure in detail with reference to the accompanying drawings. However, the embodiments of the present disclosure are not limited to specific details of the foregoing implementations. A plurality of simple variations may be made to the technical solutions of the embodiments of the present disclosure within the scope of the technical idea of the embodiments of the present disclosure. These simple variations all fall within the protection scope of the embodiments of the present disclosure.

In addition, it should be noted that the specific technical features described in the above specific implementations can be combined in any suitable manner without contradiction. In order to avoid unnecessary repetition, various possible combination manners will not be separately described in the embodiments of the present disclosure.

A person skilled in the art may understand that all or some of the steps for implementing the methods in the foregoing embodiments may be completed through a program that instructs related hardware. The program is stored in a storage medium, comprising several instructions for enabling a single-chip microcomputer, a chip, or a processor to perform all or some of the steps of the methods of the embodiments of this application. The above storage medium comprises: various media, such as a USB flash drive, a removable hard disk, a Read-Only Memory (ROM for short), a Random Access Memory (RAM for short), a magnetic disk or an optical disc, that can store program code.

Finally, it should be noted that the above embodiments are merely used for describing rather than limiting the technical solutions of the embodiments of the present disclosure. Although the embodiments of the present disclosure are described in detail with reference to the foregoing embodiments, those of ordinary skill in the art should understand that the technical solutions specified in the above embodiments can still be modified, or some or all of the technical features therein can be equivalently substituted; and such modifications or substitutions do not make the essence of the corresponding technical solutions depart from the scope of the technical solutions of each of the embodiments of the present disclosure. In addition, the various implementations of the embodiments of the present disclosure may be combined at random without deviating from the idea of the embodiments of the present disclosure, and the combined implementations also should be deemed as content disclosed in the embodiments of the present disclosure.

The invention claimed is:

1. A method for displaying, on an electronic device, item information in a current space, wherein the method comprises:

obtaining spatial data of a current position in the current space, and obtaining position data and information data of at least one item in the current space according to the spatial data, wherein the spatial data comprises position data of the current position and current viewing angle data;

calculating a display priority of the information data of the at least one item in the current space according to the spatial data, the position data, and the information data;

displaying, on the electronic device, the information data of the at least one item according to the display priority;

updating the position data of the current position and current viewing angle data to default position data and default viewing angle data of a changed current position in a case that the current position is changed; and updating the current viewing angle data in a case that a current viewing angle is changed.

2. The method according to claim 1, wherein, the spatial data comprises position data of the current position and current viewing angle data; and the step of obtaining spatial data of a current position in the current space, and obtaining position data and information data of at least one item in the current space according to the spatial data comprises:

obtaining the position data of the current position and the current viewing angle data in response to a user operation;

determining a database of the current space according to the position data of the current position; and obtaining position data and information data of the at least one item within a current viewing angle range from the database according to the position data of the current position and the current viewing angle data, wherein the current viewing angle range comprises the current space.

3. The method according to claim 2, wherein, the current viewing angle range further comprises a connected space, the connected space being in communication with the current space through an opening; and the at least one item within the current viewing angle range further comprises an item in the connected space viewable from the current viewing angle, and the position data and the information data of the at least one item within the current viewing angle range comprise position data of the item in the connected space viewable from the current viewing angle and information data of the item in the connected space viewable from the current viewing angle.

4. The method according to claim 2, wherein the step of calculating a display priority of the information data of the at least one item in the current space according to the spatial data, the position data, and the information data comprises:

calculating a distance from the at least one item to the current position in the current space according to the position data of the current position and the position data and the information data of the at least one item in the current space; and setting display priorities in descending order for the information data of the at least one item in the current space according to distances in ascending order.

5. The method according to claim 4, further comprising:
setting the display priority of the information data of the at least one item in the current space if a distance from the at least one item to the current position in the current space is less than a preset distance; and setting the display priority of the information data of the at least one item within the current viewing angle range if definition of the at least one item within the current viewing angle range is higher than preset definition.

6. The method according to claim 4, wherein
the information data comprises dimension data of the item; and
the step of calculating a distance from the at least one item to the current position in the current space according to the position data of the current position and the position data and the information data of the at least one item in the current space comprises:
according to the dimension data and the position data of the at least one item in the current space, calculating position data of a surface of the at least one item in the current space, and determining a shortest straight-line distance from the surface of the at least one item to the current position in the current space as the distance from the at least one item to the current position in the current space; or
according to the dimension data and the position data of the at least one item in the current space, calculating position data of a central position of the at least one item in the current space, and determining a straight-line distance from the central position to the current position as the distance from the at least one item to the current position in the current space.

7. The method according to claim 2, wherein
the display priority comprises a first display priority; and
the step of calculating a display priority of the at least one item in the current space according to the spatial data, the position data, and the information data comprises:
when the information data of the at least one item within the current viewing angle range is obtained, calculating a first distance from the at least one item within the current viewing angle range to the current position according to the position data of the current position and the position data and the information data of the at least one item within the current viewing angle range; and setting first display priorities in descending order for the information data of the at least one item within the current viewing angle range according to first distances in ascending order.

8. The method according to claim 7, wherein
the display priority further comprises a second display priority; and
the step of calculating a display priority of the at least one item in the current space according to the spatial data, the position data, and the information data further comprises:
when the information data of the at least one item within the current viewing angle range is obtained, calculating a second distance from the at least one item beyond the current viewing angle range to the current position according to the position data of the current position and the position data and the information data of the at least one item beyond the current viewing angle range; and setting second display priorities in descending order for the information data of the at least one item beyond the current viewing angle range according to second distances in ascending order,
wherein the second display priority is lower than the first display priority.

9. The method according to claim 8, wherein the step of displaying the information data of the at least one item in the current space according to the display priority comprises:
sequentially displaying the information data from top to bottom according to the first display priorities when a user views the information data of the at least one item within the current viewing angle range;
sequentially displaying the information data from top to bottom according to the first display priorities and the second display priorities; or
sequentially displaying the information data from top to bottom only according to the first display priorities, and in a case that the user views the information data of the at least one item beyond the current viewing angle range, sequentially displaying the information data from top to bottom according to the second display priorities.

10. The method according to claim 1, further comprising:
receiving a point contact instruction for a visible item in the at least one item; and
providing description information of the visible item in response to the point contact instruction.

11. The method according to claim 10, wherein the method for generating the point contact instruction comprises:
generating a direction point based on a point contact position of a user;
generating a direction line in a direction of a connecting line between the current position and the direction point; and
generating the point contact instruction for the visible item in a case that the direction line intersects a surface of the visible item for the first time,
wherein the direction point is a spatial coordinate point of the point in the current space.

12. The method according to claim 10, wherein the description information comprises at least one of the following: dimension information, price information, brand information, and sales information.

13. An electronic device, comprising:
a display,
a processor, and
a memory storing a program, the program comprising instructions that, when executed by the processor, cause the electronic device to perform processing comprising:
obtaining spatial data of a current position in the current space, and obtaining position data and information data of at least one item in the current space according to the spatial data, wherein the spatial data comprises position data of the current position and current viewing angle data;
calculating a display priority of the information data of the at least one item in the current space according to the spatial data, the position data, and the information data;
displaying the information data of the at least one item according to the display priority;

updating the position data of the current position and current viewing angle data to default position data and default viewing angle data of a changed current position in a case that the current position is changed; and updating the current viewing angle data in a case that a current viewing angle is changed.

14. The electronic device according to claim 13, wherein:
the spatial data comprises position data of the current position and current viewing angle data; and obtaining spatial data of a current position in the current space, and obtaining position data and information data of at least one item in the current space according to the spatial data comprises:

obtaining the position data of the current position and the current viewing angle data in response to a user operation;

determining a database of the current space according to the position data of the current position; and obtaining position data and information data of the at least one item within a current viewing angle range from the database according to the position data of the current position and the current viewing angle data, wherein the current viewing angle range comprises the current space.

15. The electronic device according to claim 14 wherein:
the current viewing angle range further comprises a connected space, the connected space being in communication with the current space through an opening; and the at least one item within the current viewing angle range further comprises an item in the connected space viewable from the current viewing angle, and the position data and the information data of the at least one item within the current viewing angle range comprise position data of the item in the connected space viewable from the current viewing angle and information data of the item in the connected space viewable from the current viewing angle.

16. The electronic device according to claim 14, wherein calculating a display priority of the information data of the at least one item in the current space according to the spatial data, the position data, and the information data comprises:

calculating a distance from the at least one item to the current position in the current space according to the position data of the current position and the position data and the information data of the at least one item in the current space; and setting display priorities in descending order for the information data of the at least one item in the current space according to distances in ascending order.

17. The electronic device according to claim 16, wherein the instructions, when executed by the processor, cause the electronic device to perform processing further comprising:

setting the display priority of the information data of the at least one item in the current space if a distance from the at least one item to the current position in the current space is less than a preset distance; and setting the display priority of the information data of the at least one item within the current viewing angle range if definition of the at least one item within the current viewing angle range is higher than preset definition.

18. The electronic device according to claim 13, further comprising:

a communications interface configured to receive a point contact instruction from a user, wherein the instructions, when executed by the processor, further cause the electronic device to perform the following steps:

receiving a point contact instruction for any visible item in the at least one item; and providing description information of the visible item in response to the point contact instruction.

19. A non-transitory computer-readable storage medium having computer program instructions stored thereon, wherein the computer program instructions, when executed by an electronic device having a display and a processor, cause the electronic device to perform processing comprising:

obtaining spatial data of a current position in the current space, and obtaining position data and information data of at least one item in the current space according to the spatial data, wherein the spatial data comprises position data of the current position and current viewing angle data;

calculating a display priority of the information data of the at least one item in the current space according to the spatial data, the position data, and the information data;

displaying the information data of the at least one item according to the display priority;

updating the position data of the current position and current viewing angle data to default position data and default viewing angle data of a changed current position in a case that the current position is changed; and updating the current viewing angle data in a case that a current viewing angle is changed.

* * * * *